(12) United States Patent
Chou et al.

(10) Patent No.: US 11,669,014 B2
(45) Date of Patent: *Jun. 6, 2023

(54) GAMMA RAY GENERATOR AND METHOD OF GENERATING GAMMA RAY

(71) Applicant: Taiwan Semiconductor Manufacturing Company, Ltd., Hsinchu (TW)

(72) Inventors: You-Hua Chou, Hsinchu (TW); Kuo-Sheng Chuang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/874,317

(22) Filed: Jul. 27, 2022

(65) Prior Publication Data

US 2022/0357663 A1    Nov. 10, 2022

Related U.S. Application Data

(63) Continuation of application No. 17/378,801, filed on Jul. 19, 2021, now Pat. No. 11,460,779, which is a continuation of application No. 16/896,218, filed on Jun. 9, 2020, now Pat. No. 11,067,898.

(60) Provisional application No. 62/880,669, filed on Jul. 31, 2019.

(51) Int. Cl.
  *G03F 7/20*    (2006.01)
  *G21G 4/00*    (2006.01)
  *G01T 1/16*    (2006.01)

(52) U.S. Cl.
  CPC ............ *G03F 7/70008* (2013.01); *G01T 1/16* (2013.01); *G03F 7/7005* (2013.01); *G03F 7/7085* (2013.01); *G03F 7/70316* (2013.01); *G03F 7/70558* (2013.01); *G21G 4/00* (2013.01)

(58) Field of Classification Search
  CPC ............... G03F 7/70008; G03F 7/7005; G03F 7/70316; G03F 7/70558; G03F 7/7085; G03F 7/70075; G03F 7/70291; G03F 7/7035; G03F 7/70; G03F 7/7015; G03F 7/70166; G03F 7/70191; G03F 7/70375; G03F 7/70425; G03F 7/7055; G03F 7/70825; G03F 7/70833; G03F 7/7095; G01T 1/16; G21G 4/00; G21G 4/06
  USPC .. 355/1, 400, 18, 30, 46, 53, 55, 67–71, 77, 355/133; 378/34, 35, 119, 145, 156, 160, 378/193, 197, 198, 203, 207; 250/370.09
  See application file for complete search history.

(56) References Cited

U.S. PATENT DOCUMENTS

| | | | | |
|---|---|---|---|---|
| 3,840,746 A | * | 10/1974 | Kehler | G01V 5/12 378/160 |
| 3,842,285 A | * | 10/1974 | Edeline | G01T 1/178 378/160 |
| 5,528,653 A | * | 6/1996 | Song | A61N 5/1084 378/65 |

(Continued)

*Primary Examiner* — Christina A Riddle
(74) *Attorney, Agent, or Firm* — JCIPRNET (57) ABSTRACT

A gamma ray generator includes a rotational shaft, a plurality of holders and a plurality of gamma ray sources. The holders are connected to the rotational shaft. The gamma ray sources are disposed in the holders respectively, wherein the holders respectively have an upper portion and a lower portion connecting to the upper portion, and the gamma ray source is placed at an interface between the upper portion and the lower portion.

20 Claims, 9 Drawing Sheets

(56) References Cited

U.S. PATENT DOCUMENTS

| | | | | |
|---|---|---|---|---|
| 5,567,570 A | * | 10/1996 | Rostoker | ............... G03F 7/7035 |
| | | | | 430/311 |
| 11,067,898 B2 | * | 7/2021 | Chou | .................. G03F 7/70291 |
| 11,460,779 B2 | * | 10/2022 | Chou | ....................... G21G 4/06 |

* cited by examiner

GAMMA RAY GENERATOR AND METHOD OF GENERATING GAMMA RAY

CROSS-REFERENCE TO RELATED APPLICATION

This application is a continuation application of and claims the priority benefit of a prior application Ser. No. 17/378,801, filed on Jul. 19, 2021. The prior application Ser. No. 17/378,801 is a continuation application of and claims the priority benefits of a prior application Ser. No. 16/896,218, filed on Jun. 9, 2020 which claims the priority benefits of a provisional application Ser. No. 62/880,669, filed on Jul. 31, 2019. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. The decrease in size of devices has been met with advancements in semiconductor manufacturing techniques such as lithography.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

In accordance with some embodiments of the present disclosure, gamma ray is applied to lithography. Since the gamma ray exhibits a shorter wavelength than visible light or even x ray, the gamma ray has the inherent capability of providing better resolution. In addition, the gamma ray may be provided uniformly through a gamma ray generator in accordance with some embodiments of the present disclosure, and thus the lithography may be performed with a desired exposure condition.

Figure 1:
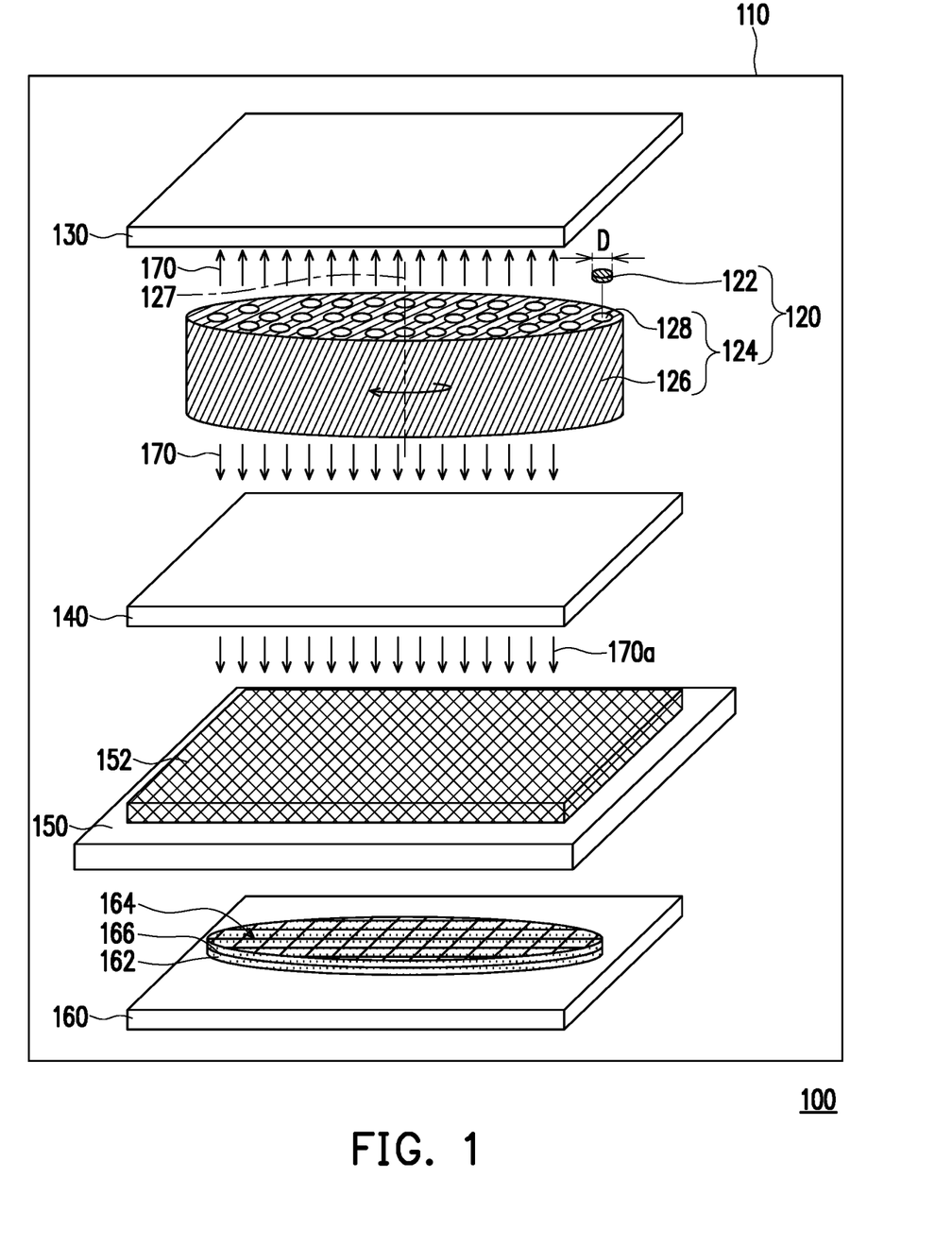
FIG. 1 illustrates a gamma ray lithography system according to some exemplary embodiments of the present disclosure.
Figure 2:
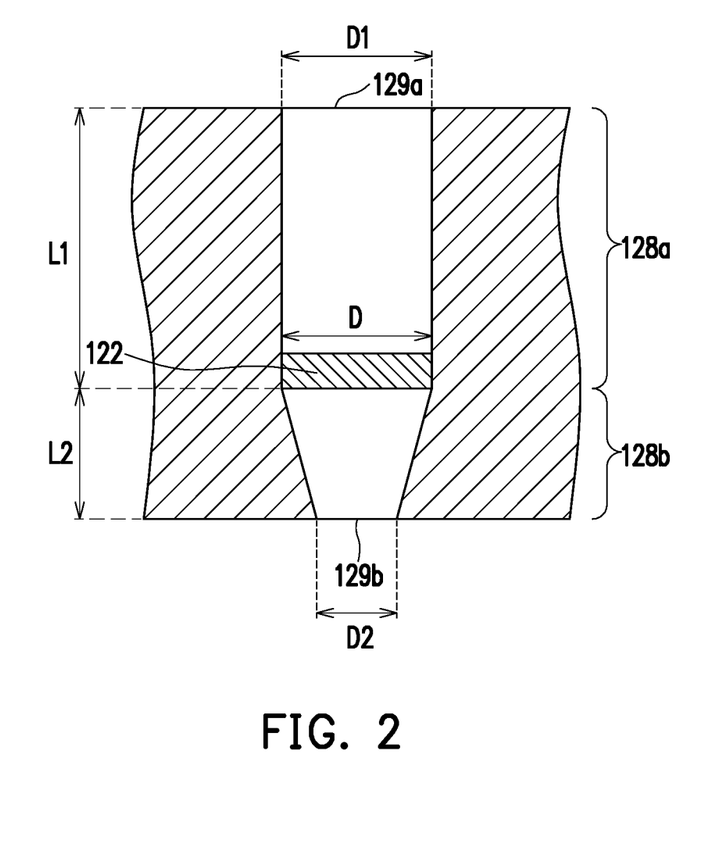
FIG. 2 illustrates a schematic cross-sectional view of a hole in a rotational carrier of a gamma ray generator according to some exemplary embodiments of the present disclosure.
Figure 3A:
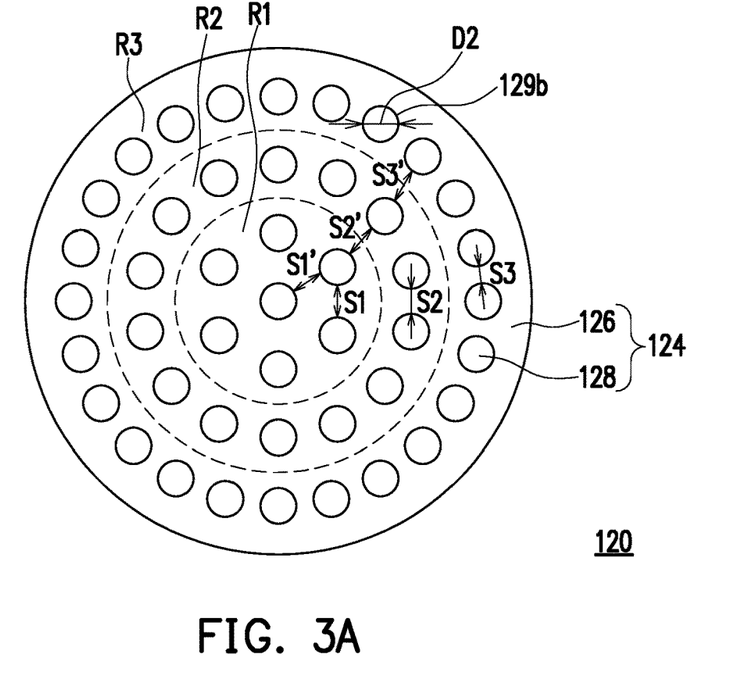
FIGS. 3A to 3C respectively illustrate a bottom view of a rotational carrier of a gamma ray generator according to some exemplary embodiments of the present disclosure.
Figure 3B:
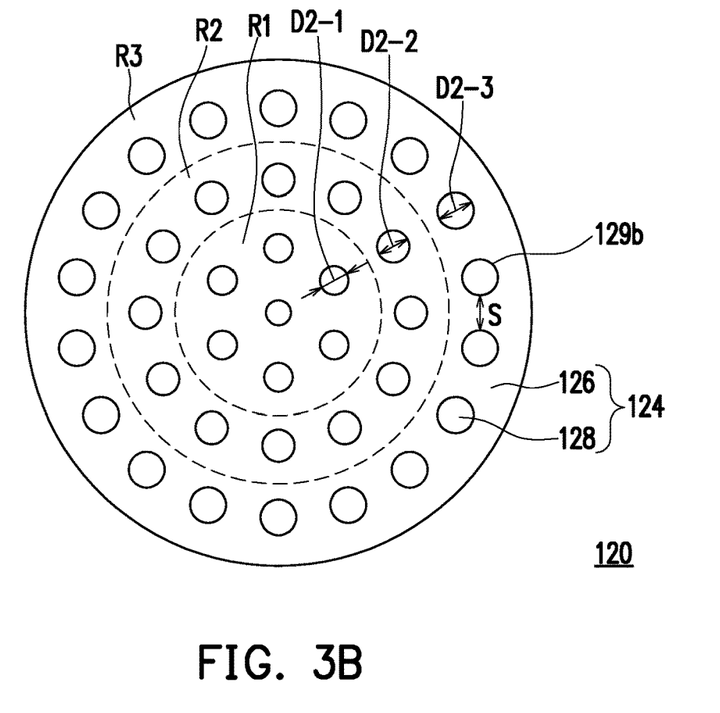
Figure 3C:
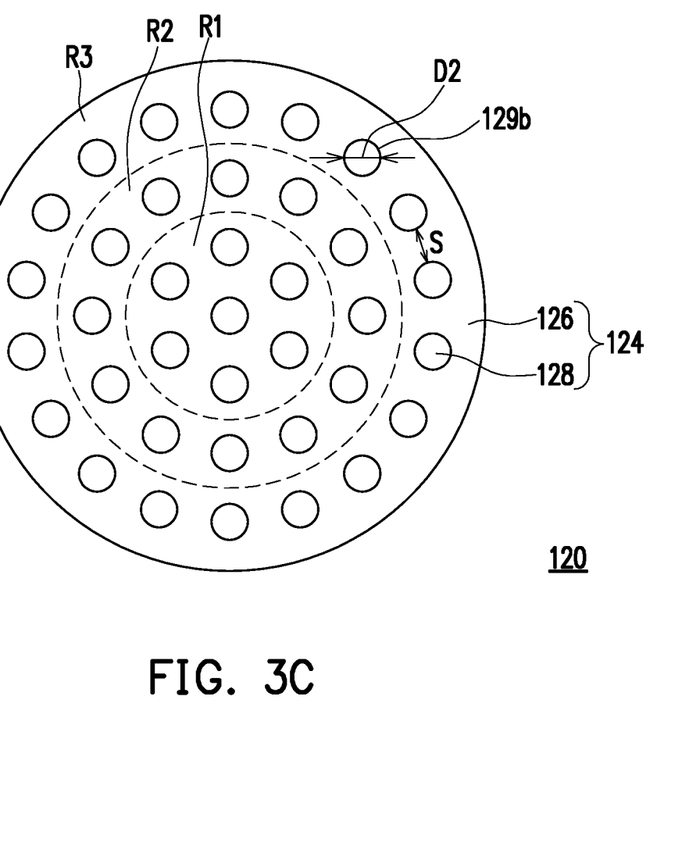
Figure 4A:
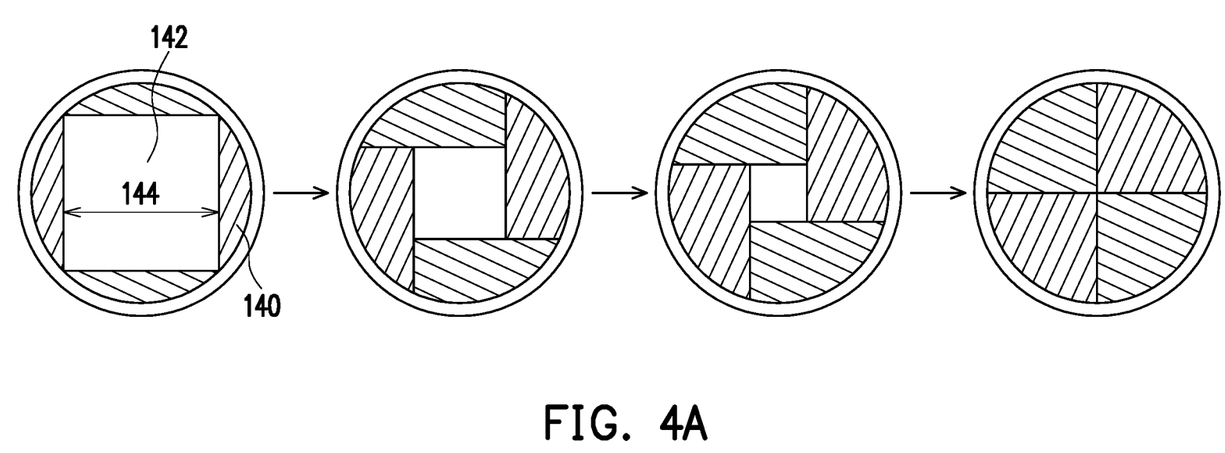
FIGS. 4A to 4D respectively illustrate a schematic diagram of various shutter elements according to some exemplary embodiments of the present disclosure.
Figure 4B:
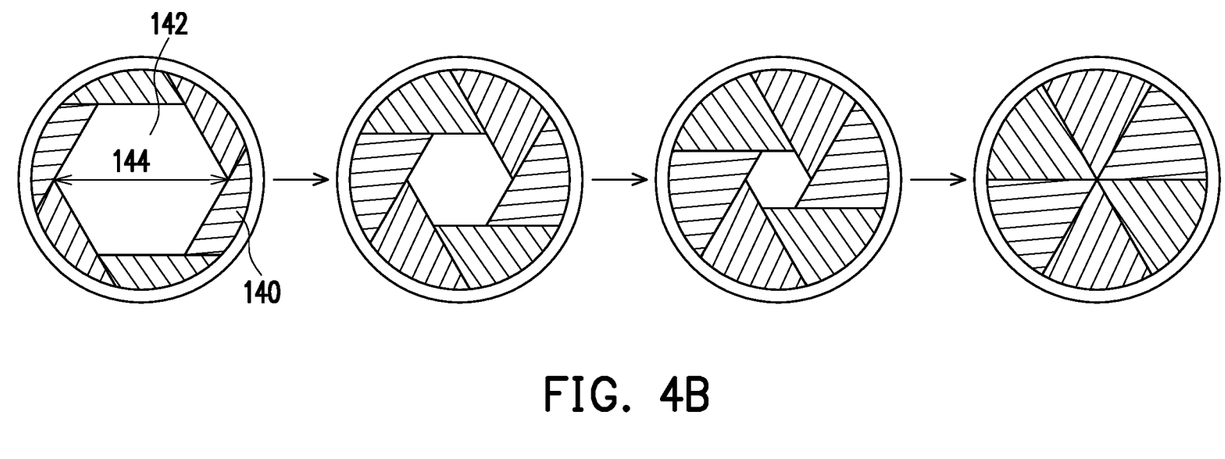
Figure 4C:
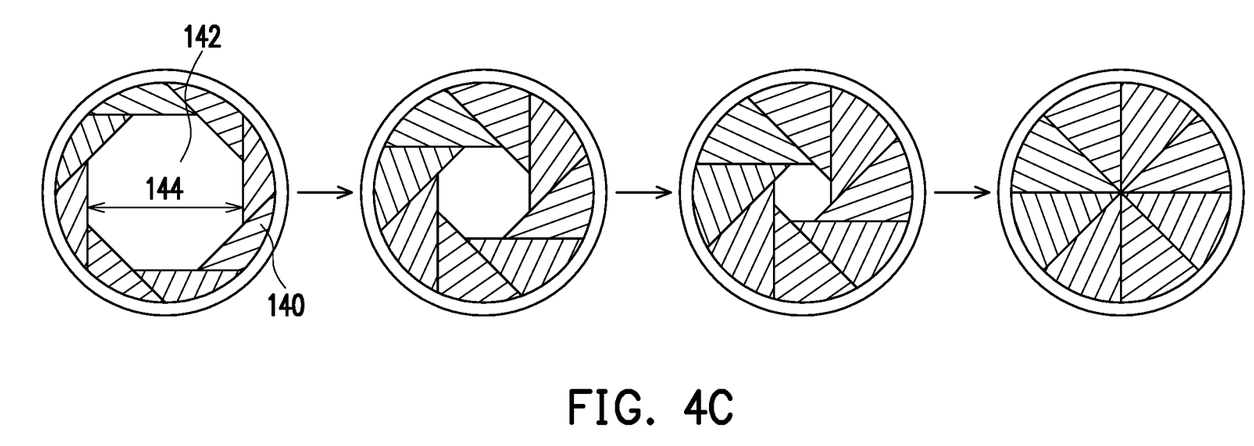
Figure 4D:
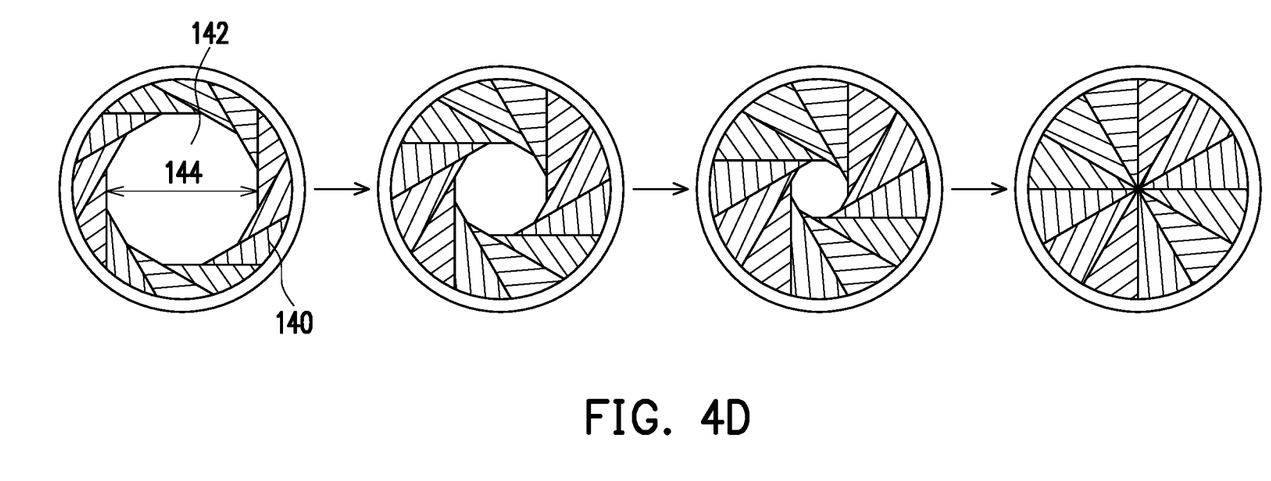

FIG. 1 illustrates a gamma ray lithography system according to some exemplary embodiments of the present disclosure. FIG. 2 illustrates a schematic cross-sectional view of a hole in a rotational carrier of a gamma ray generator according to some exemplary embodiments of the present disclosure. FIGS. 3A to 3C respectively illustrate a bottom view of a rotational carrier of a gamma ray generator according to some exemplary embodiments of the present disclosure. FIGS. 4A to 4D respectively illustrate a schematic diagram of various shutter elements according to some exemplary embodiments of the present disclosure.

Referring to FIG. 1, a gamma ray lithography system 100 is provided. In some embodiments, the gamma ray lithography system 100 includes a chamber 110, a gamma ray generator 120, a gamma ray detector 130, a shutter 140, a mask stage 150 and a wafer stage 160. The gamma ray generator 120, the gamma ray detector 130, the shutter 140, the mask stage 150 and the wafer stage 160 are disposed in the chamber 110. In some embodiments, the chamber 110 is enclosed to provide a desired environment such as a dark environment, to perform the gamma ray lithography.

The gamma ray generator 120 is configured to generate a substantially uniform gamma ray 170. In some embodiments, the gamma ray generator 120 includes a plurality of gamma ray sources 122 and a rotational carrier 124. The gamma ray sources 122 radiate gamma rays. Generally, the gamma rays have a frequency on the order of $10^{19}$ to $10^{22}$ Hz, and a wavelength on the order of $10^{-10}$ to $10^{-12}$ meters. In some embodiments, a wavelength of the gamma ray is less than 3 angstroms. In some embodiments, the radiative intensities of the gamma ray sources 122 are similar to each other but not exactly the same. By rotating the gamma ray sources 122, the substantially uniform gamma ray 170 is obtained. In some embodiments, the gamma ray sources 122 are or include radiative metal ingots, pills or pellets, such as Cobalt-60, Caesium-137, Iridium-192 and the like. The radiative metal ingot, pill or pellet may be a cylinder having a consistent diameter D. However, the disclosure is not limited thereto. In some alternative embodiments, the gamma ray sources 122 may have different sizes (e.g., diameter) and/or shapes.

In some embodiments, the rotational carrier 124 includes a main body 126 and a plurality of holes 128 in the main body 126. The main body 126 is configured to rotate along a rotational axis 127 which may be also a central axis of the main body 126. The rotational axis 127 is substantially perpendicular to an exposed surface 164 of a wafer 162 secured on the wafer stage 160, for example. However, the disclosure is not limited thereto. In some alternative embodiments, the rotational axis 127 may be configured at an angle with respect to the exposed surface 164 of the wafer 162 secured on the wafer stage 160. As shown in FIG. 1, the main body 126 is a circular plate. However, the disclosure is not limited thereto. In some alternative embodiments, the main body 126 may have other suitable shape. The main body 126 is made of a gamma ray shielding material, such as tungsten, lead, combinations thereof, and/or another suitable material.

Referring to FIG. 1 and FIG. 2, the holes 128 are configured to hold the gamma ray sources 122 and provide a directional tunnel for gamma rays. In some embodiments, the holes 128 penetrate the main body 126 respectively. The hole 128 has a top opening 129a and a bottom opening 129b opposite to each other. The top opening 129a is an inlet for the gamma ray source 122, and the bottom opening 129b is an outlet for the gamma ray radiating from the gamma ray source 122. A diameter D1 of the top opening 129a is larger than the diameter D of the ingot, pill or pellet of the gamma ray source 122, so that the gamma ray source 122 may be placed into the hole 128. For example, the diameter D1 is substantially the same as the ingot, pill or pellet of the gamma ray source 122. A diameter D2 is smaller than the diameter D of the ingot, pill or pellet of the gamma ray source 122, and thus the placed gamma ray source 122 may be held in the hole 128. In some embodiments, the diameter D2 is about 90% to 99% of the diameter D1 (e.g., the diameter D), to hold the gamma ray sources 122 between the top opening 129a and the bottom opening 129b.

In some embodiments, the hole 128 has a containing portion 128a (e.g., a top portion) and a tunnel portion 128b (e.g., a bottom portion). The containing portion 128a and the tunnel portion 128b are physically connected. The containing portion 128a is configured to contain the gamma ray source 122. The diameter of the containing portion 128a is not less than the diameter D of the ingot, pill or pellet of the gamma ray source 122. Therefore, the ingot, pill or pellet of the gamma ray source 122 may be inserted into the containing portion 128a. For example, the containing portion 128a has a cylindrical profile, that is, the containing portion 128a has a substantially constant diameter. The substantially constant diameter may be substantially the same as the diameter D. Further, the diameter D1 of the top opening 129a is also the diameter of the containing portion 128a at the topmost. The tunnel portion 128b is configured to provide a tunnel for gamma rays radiating from the gamma ray source 122. In some embodiments, the diameter of the tunnel portion 128b is less than the diameter D of the ingot, pill or pellet of the gamma ray source 122. Therefore, the ingot, pill or pellet of the gamma ray source 122 may be held in the hole 128 after insertion. In some embodiments, the tunnel portion 128b has a tapered profile wherein the diameter of the tunnel portion 128b is gradually reduced from top to bottom. The diameter D2 of the bottom opening 129b is the diameter of the tunnel portion 128b at the bottommost, which is also the smallest diameter of the tunnel portion 128b. However, in some alternative embodiments, the containing portion 128a and the tunnel portion 128b may have other suitable shapes.

In some embodiments, the containing portion 128a has a first length L1, and the tunnel portion 128b has a second length L2. The first length L1 may be larger than the second length L2, and thus the gamma ray sources 122 may be close to the outlet of the tunnel portion 128b (e.g., the bottom opening 129b of the hole 128). For example, a ratio of the first length L1 to the second length L2 is in a range of about 2 to about 3. A total length of the holes 128 (e.g., a thickness of the main body 126) is in a range of about 2 cm to about 8 cm, for example.

In some embodiments, the gamma ray generator 120 may further include an actuated mechanism (not shown) such as a robot arm, to perform the placement (e.g., upload and unload) of the gamma ray sources 122 into the holes 128. However, the disclosure is not limited thereto. In some alternative embodiments, the placement of the gamma ray sources 122 may be manually operated with gamma ray protective clothing.

The gamma ray sources 122 generally emit gamma rays of slightly different radiative intensity. In some embodiments, in order to compensate the difference, the gamma ray sources 122 are rotated with adjustment of at least one of the separation between the holes 128, the diameter of the holes 128 and the intensity of the gamma ray source 122, so as to generate the substantially uniform gamma ray 170. The separation of between the holes, the diameters of the holes and the intensities of the gamma ray source will be discussed below.

In some embodiments, the holes 128 are arranged in an array or a matrix to surround the rotational axis 127. For example, the holes 128 are arranged in a plurality of circles from the outer to the inner along a periphery of the main body 126. As shown in FIG. 3A, from a bottom view, separations S1, S2, S3 between the adjacent holes 128 increase as the holes 128 become closer to the rotational axis 127. That is, the separation S3 is smaller than the separation S2, and the separation S2 is smaller than the separation S1. In some embodiments, the holes 128 are disposed in a center region R1, an intermediate region R2 and an outer region R3 of the main body 126 from the inner to the outer. The separation S1 in the center region R1 is larger than the separation S2 in the intermediate region R2, and the separation S2 in the intermediate region R2 is larger than the separation S3 in the outer region R3. In addition, in some embodiments, separations S1', S2', S3' between the adjacent holes 128 increase as the separations S1', S2', S3' become closer to the rotational axis 127. For example, the separation S1' is larger than the separation S2', and the separation S2' is larger than the separation S3'.

In some embodiments, the diameter D2 of the holes 128 may be substantially the same. The separations S1, S2 and S3 and/or the separations S1', S2' and S3' may be designed based on the rotational velocity of the rotational carrier 124 and the locations of the holes 128. By this configuration, the radiative intensity provided by the gamma ray generator 120 at different locations of the rotational carrier 124 may be substantially the same. However, the disclosure is not limited thereto.

In some embodiments, as shown in FIG. 3B, the bottom diameter D2-1, D2-2, D2-3 of the hole 128 decreases as the hole 128 becomes closer to the rotational axis 127. That is, the bottom diameter D2-1 in the center region R1 is smaller than the bottom diameter D2-2 in the intermediate region R2, and the bottom diameter D2-2 in the intermediate region R2 is smaller than the bottom diameter D2-3 in the outer region R3. In some embodiments, the separation S between the holes 128 may be substantially the same. In some embodiments, the bottom diameters D2 of the holes 128 (e.g., the outlet of the gamma ray) may be designed based on the rotational velocity of the rotational carrier 124 and the location of the holes 128. By this configuration, the radiative intensity generated by the gamma ray generator 120 at different locations of the rotational carrier 124 may be substantially the same.

In some embodiments, as shown in FIG. 3C, the bottom diameters D2 of the holes 128 at different locations may be substantially the same and the separation S therebetween may be constant. In some embodiments, the bottom diameter D2 and the separation S in the center region R1 is substantially the same as the bottom diameter D2 and the separation S in the intermediate region R2. The bottom diameter D2 and the separation S in the intermediate region R2 is substantially the same as the bottom diameter D2 and the separation S in the outer region R3. In this case, the radiative intensity of the gamma ray sources 122 may be different and designed based on the rotational velocity of the rotational carrier 124 and the location of the holes 128. For example, the radiative intensity of the gamma ray source 122 decreases as the gamma ray source 122 becomes closer to the rotational axis 127. That is, the radiative intensity of the gamma ray source 122 in the center region R1 is smaller than the radiative intensity of the gamma ray source 122 in the intermediate region R2, and the radiative intensity of the gamma ray source 122 in the intermediate region R2 is smaller than the radiative intensity of the gamma ray source 122 in the outer region R3. By this configuration, the radiative intensity provided by the gamma ray generator 120 at different locations of the rotational carrier 124 may be substantially the same.

The rotational carrier 124 is rotatably mounted to a support (not shown) that is part of the gamma ray lithography system 100. A rotatable mounting may be any mounting device that holds the rotational carrier 124 in position for operation of the gamma ray lithography system 100 and permits the rotational carrier 124 to be rotated without detaching it from its mounting.

In some embodiments, the gamma ray source 122 is an omni-directional radiation source and provides a source of intense gamma ray radiation. The gamma ray source 122 may be Cobalt-60, Caesium-137 and Iridium-192 which passively (without any external power) radiates intense, fluent (e.g., steady, not varying or intermittent) gamma ray radiation having extremely high source brightness (intensity), due to the extreme intensity of naturally occurring gamma ray sources. The gamma ray sources 122 emit gamma rays, and the gamma rays radiate upward and downward while other portions of the gamma rays are blocked by the main body 126 of the rotational carrier 120. The gamma rays radiated upward are detected by a gamma ray detector 130, and the gamma rays radiated downward are incident into the shutter 140.

In some embodiments, by rotating the rotational carrier 124, the substantially uniform gamma ray 170 is generated. In detail, the gamma ray sources 122 generally emit gamma rays of slightly different radiative intensity. In some embodiments, by rotating the rotational carrier 124, substantially uniform gamma rays 170 are generated, which provides a uniform exposure condition. In some embodiments, the uniform gamma rays 170 are generated by adjusting rotational velocity, rotational angle and/or the like. The rotational velocity of the rotational carrier 124 may be constant and is in a range of about 1 rpm and about 100 rpm. The rotational carrier 124 may be rotated while the gamma ray lithography system 100 is online and the chamber 110 is enclosed.

In some embodiments, the gamma ray detector 130 (or gamma ray sensor) is disposed opposite to the shutter 140 with respect to gamma ray generator 120. For example, the gamma ray detector 130 is installed directly over the rotational carrier 124, and the shutter 140 is installed directly below the rotational carrier 124. The gamma ray detector 130 is configured to detect the intensity of the gamma rays 170, so as to calculate the uniformity of the gamma rays 170. The gamma ray detector 130 is configured to receive the gamma rays 170 radiated from the gamma ray sources 122 (e.g., the portions of the gamma rays radiated upward) to measure the intensity of the gamma rays 170, and then calculates the uniformity of the gamma rays 170 based on the measured intensity. In some embodiments, the gamma ray detector 130 continuously or periodically measures the intensity of the gamma rays 170 during the rotation.

In some embodiments, the shutter 140 or other "on/off" mechanism is disposed between the gamma ray generator 120 and the wafer stage 160. In some embodiments, the shutter 140 is disposed directly under and distanced from gamma ray generator 120. The distance between the shutter 140 and the gamma ray generator 120 may be in a range of about 0.5 cm to about 3 cm. The shutter 140 is configured to selectively gate (block or pass) the incident gamma rays 170, resulting in controlled gamma rays 170a. When the shutter 140 is opened, the gamma rays 170 pass through the shutter 140 and travel toward the wafer 162, and when the shutter 140 is closed, the gamma rays 170 are blocked by the shutter 140. For example, as shown in FIG. 4A to FIG. 4D, the shutter 140 controls a diameter 144 of an opening 142, so as to control the amount of gamma rays 170 passing therethrough in accordance with the requirements. Accordingly, the gamma rays 170 passing through the shutter 140 are referred to as controlled gamma rays 170a. Moreover, in some embodiments, the shutter 140 may have a shutter pattern to shape the gamma ray 170 into a particular shape, so as to provide a desired radiation pattern on the wafer stage 160. For example, as shown in FIG. 4A to FIG. 4D, the shutter pattern is square, hexagonal, octagonal or decagonal.

The mask stage 150 is disposed between the shutter 140 and the wafer stage 160. In some embodiments, the photomask 152 is directly disposed under the shutter 140 and positioned at a distance from the shutter 140. The distance is in a range of about 0.5 cm to about 3 cm, for example. A photomask 152 is secured by the mask stage 150. The photomask 152 is configured to selectively allow portions of the gamma rays 170a from the shutter 140 to travel toward the wafer stage 160 and blocks the other portion of the gamma rays 170a from traveling toward the wafer stage 160. In some embodiments, the photomask 152 is a patterned photomask plate, which includes a plurality of openings penetrating the patterned photomask plate. For example, the photomask 152 has a lattice form in which the openings are arranged in a matrix form. However, another arrangement of the openings to the photomask 152 may be deployed depending on fabrication requirements. The photomask 152 includes a gamma ray shielding material, such as tungsten, lead, combinations thereof, and/or another suitable material.

The wafer stage 160 is disposed directly below the mask stage 150 and positioned at a distance from the photomask 152. The distance is in a range of about 0.5 cm to about 3 cm, for example. The wafer stage 160 is configured to secure the wafer 162 which is to be patterned under a lithographic operation of the gamma ray lithography system 100. The wafer 162 is a silicon wafer, germanium wafer, silicon-germanium wafer, III-V wafer, or another suitable semiconductor wafer known in the art. In some embodiments, the gamma ray 170a irradiates the exposed surface 164 (e.g., a front surface) of the wafer 162. The exposed surface 164 is coated with a gamma ray sensitive layer 166 (e.g., a gamma ray sensitive resist). In some embodiments, the gamma ray sensitive layer 166 may be used as a hard mask layer, a material layer for forming insulating patterns or conductive patterns or the like.

In some embodiments, the gamma ray sensitive layer 166 includes a gamma ray sensitive material which produces electrical charges upon absorption of gamma ray photons. In some embodiments, the gamma ray sensitive material includes silver salt such as silver halide (e.g., silver fluoride, silver chloride, silver bromide or silver iodide), silver nitrate, silver acetate, silver carbonate, the like, or combinations thereof. For example, when the silver salt is irradiated by the gamma ray, silver ion (AO in the silver salt is reduced to metallic silver (Ag). In other words, reduction reaction occurs when the gamma ray sensitive layer 166 is irradiated by the gamma rays 170a. In this case, when the gamma ray lithography is performed, the chamber 110 is enclosed to provide a dark environment, so as to prevent the decomposition of the silver compound. However, the disclosure is not limited thereto. In some embodiments, the wafer 162 is mounted to a movable carriage (not shown) for direct-write application, by which means the wafer 162 may be positioned such that any point on the gamma ray sensitive layer 166 may be exposed by the gamma rays 170a.

In some embodiments, the gamma ray lithography system 100 further includes other components in accordance with the requirements. For example, the gamma ray lithography system 100 may further include a component which is configured to tilt the gamma ray generator 110 and the shutter 140 with an angle with respect to the exposed surface 164 of the wafer 162.

Figure 5:
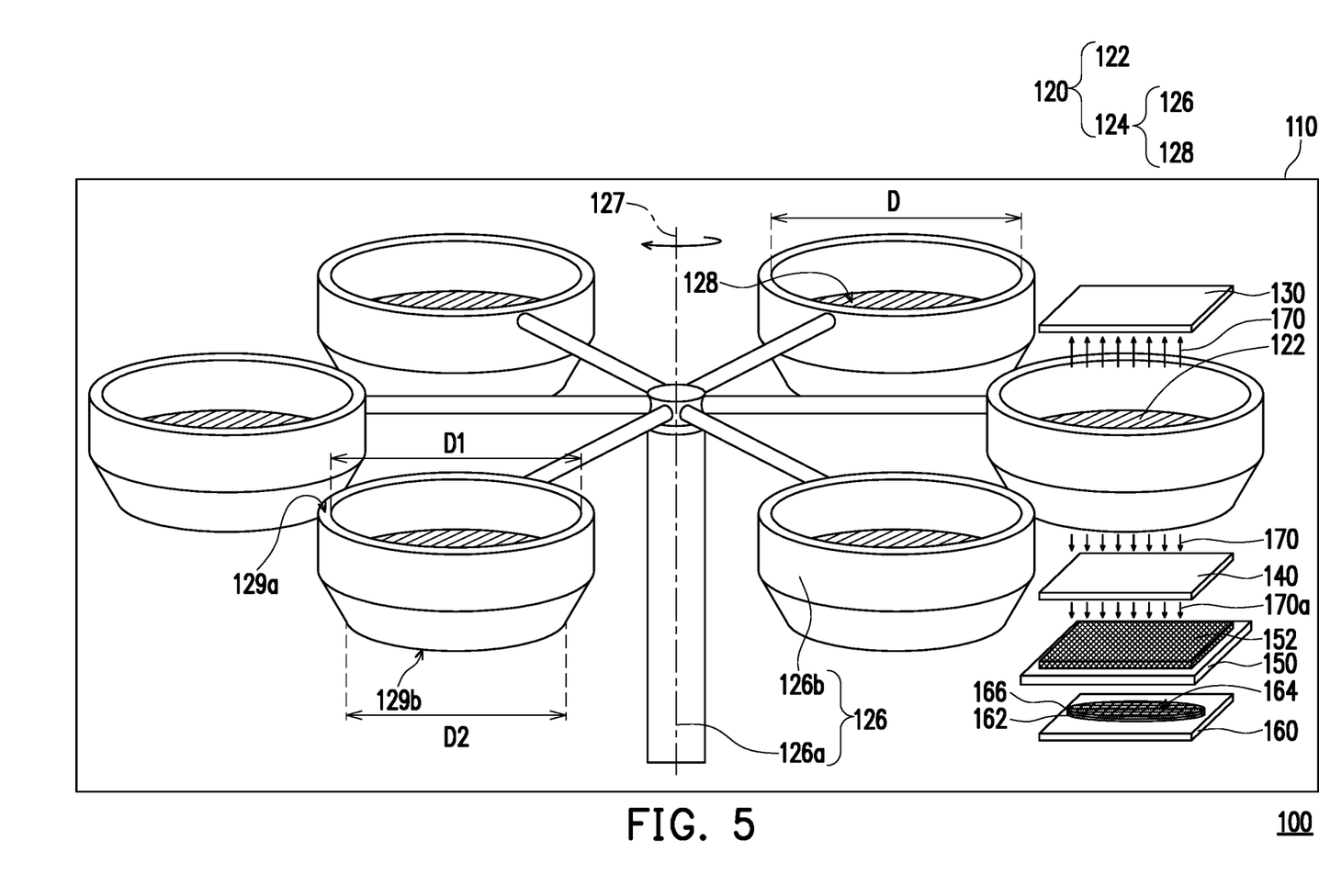
FIG. 5 illustrates a gamma ray lithography system according to some exemplary embodiments of the present disclosure.

FIG. 5 illustrates a gamma ray lithography system according to some exemplary embodiments of the present disclosure. The main difference between the gamma ray lithography system of FIG. 5 and the gamma ray lithography system of FIG. 1 lies in a configuration of a gamma ray generator, hence the same reference numerals are used to refer to the same and like parts, and its detailed description will be omitted herein. The difference is illustrated in details below.

Referring to FIG. 5, a gamma ray lithography system 100 includes a chamber 110, a gamma ray generator 120, a gamma ray detector 130, a shutter 140, a mask stage 150 and a wafer stage 160. The chamber 110, the gamma ray generator 120, the gamma ray detector 130, the shutter 140, the mask stage 150 and the wafer stage 160 are similar to those of FIG. 1, and thus the details thereof are omitted herein.

In some embodiments, the gamma ray generator 120 is configured to generate a substantially uniform gamma ray 170. In some embodiments, the gamma ray generator 120 includes a plurality of gamma ray sources 122 and a rotational carrier 124. In some embodiments, the gamma ray sources 122 may be radiative metal blocks. A diameter D of the gamma ray sources 122 may be in a range of about 0.5 cm to about 2 cm. The rotational carrier 124 includes a main body 126 and a plurality of holes 128 in the main body 126. The main body 126 is configured to rotate along a rotational axis 127 which may be also a central axis of the main body 126. The rotational axis 127 is substantially perpendicular to an exposed surface 164 of a wafer 162 secured on the wafer stage 160, for example. However, the disclosure is not limited thereto. In some embodiments, the main body 126 includes a shaft 126a and a plurality of holders 126b. The shaft 126a is rotated along the rotational axis 127. The holders 126b are physically connected to the shaft 126a and are configured to hold the gamma ray sources 122 respectively. For example, the holder 126b includes a hole 128 therein. The hole 128 is configured to accommodate the gamma ray source 122 and provide a directional tunnel for gamma ray. In some embodiments, the hole 128 has a configuration similar to the hole 128 of FIG. 2, and the details thereof is omitted herein. However, the disclosure is not limited thereto. In some alternative embodiments, the hole 128 may have other suitable configuration.

In some embodiments, the hole 128 has a top opening 129a and a bottom opening 129b opposite to each other. The top opening 129a is an inlet for the gamma ray source 122, and the bottom opening 129b is an outlet for the gamma ray radiating from the gamma ray source 122. A diameter D1 of the top opening 129a is not smaller than the diameter D of the block of the gamma ray source 122, so that the gamma ray source 122 may be placed into the hole 128. For example, the diameter D1 is substantially the same as the block of the gamma ray source 122. A diameter D2 is smaller than the diameter D of the block of the gamma ray source 122, and thus the placed gamma ray source 122 may be held in the hole 128. In some embodiments, the diameter D2 is about 90% to 99% of the diameter D1 (e.g., the diameter D). Further, in some embodiments, an area of the bottom opening 129b of the hole 128 is larger than a total area of a photomask 152 on the mask stage 150 therebeneath. Therefore, even the shutter 140 is opened completely, the gamma ray irradiates the entire photomask 152.

In some embodiments, by rotating the rotational carrier 124, the substantially uniform gamma rays 170 are generated. In detail, the gamma ray sources 122 irradiate gamma rays respectively, however, the radiative intensity of the gamma ray sources 122 may be slightly different from each other. In other words, the gamma ray may be radiated with different intensity. In some embodiments, by rotating the rotational carrier 124, substantially uniform gamma rays 170 are generated, which provides a uniform exposure condition. In some embodiments, the uniform gamma rays 170 are generated by adjusting rotational velocity, rotational angle and/or the like. The rotational velocity of the rotational carrier 124 may be constant and is in a range of about 1 rpm and about 100 rpm. The rotational carrier 124 may be rotated while the gamma ray lithography system 100 is online and the chamber 110 is enclosed.

Figure 6:
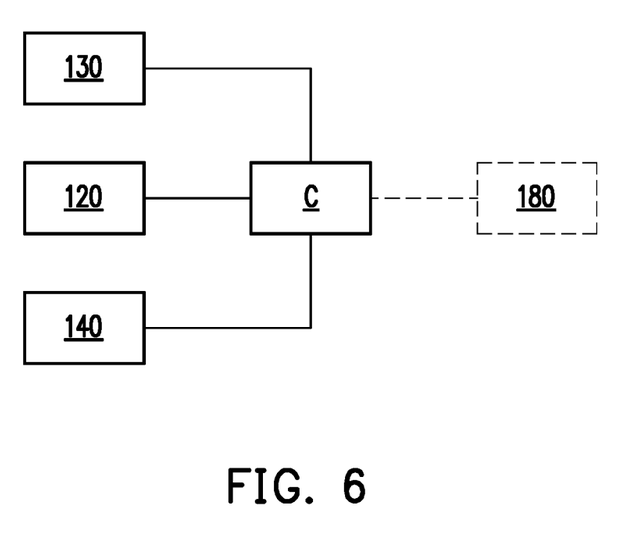
FIG. 6 illustrates a block diagram of a gamma ray lithography system according to some exemplary embodiments of the present disclosure.

FIG. 6 illustrates a block diagram of a gamma ray lithography system according to some exemplary embodiments of the present disclosure. In some embodiments, as shown in FIG. 6, the gamma ray lithography system 100 further includes a controller C. The controller C is electrically connected to the gamma ray detector 130, the shutter 140 and/or the rotational carrier 124. The controller C is configured to, or programmed to, control the shutter 140 and/or the rotational carrier 124. For example, when the intensity and/or the uniformity of the gamma ray 170 obtained by the gamma ray detector 130 reaches a predetermined value, the controller C turns on the shutter 140 and the rotational carrier 124 and controls the operation parameters of the shutter 140 and/or the rotational carrier 124, to perform the exposure with a pre-determined exposure condition. In some embodiments, the operation parameters of the shutter 140 includes the diameter 144 of the opening 142 of the shutter 140, a turn-on time and the like. For example, if the measured intensity of the gamma ray 170 is high, the diameter 144 of the opening 142 and/or the turn-on time of the shutter 140 may be reduced, and otherwise, if the intensity of the gamma ray 170 is low, the diameter 144 of the opening 142 and/or the turn-on time of the shutter 140 may be increased, so as to achieve a desired exposure intensity. In some embodiments, the operation parameters of the rotational carrier 124 includes the rotational velocity, a time period for operation, a distance between the shutter and the rotational carrier and the like.

When the intensity and/or the uniformity of the gamma ray 170 obtained by the gamma ray detector 130 does not reach the predetermined value, the controller C turns off the shutter 140 and/or the rotational carrier 124, so as to prevent an undesired exposure. Then, the gamma ray sources 122 such as the metal ingots, metal pills, metal pellets and metal blocks are removed and replaced with new ones automatically or manually. In the embodiment the gamma ray sources 122 are automatically removed (unload) and replaced (reload), the gamma ray lithography system 100 may further include an actuated mechanism 180 such as a robot arm, and the controller C is further configured to, or programmed to actuate the actuated mechanism.

Figure 7:
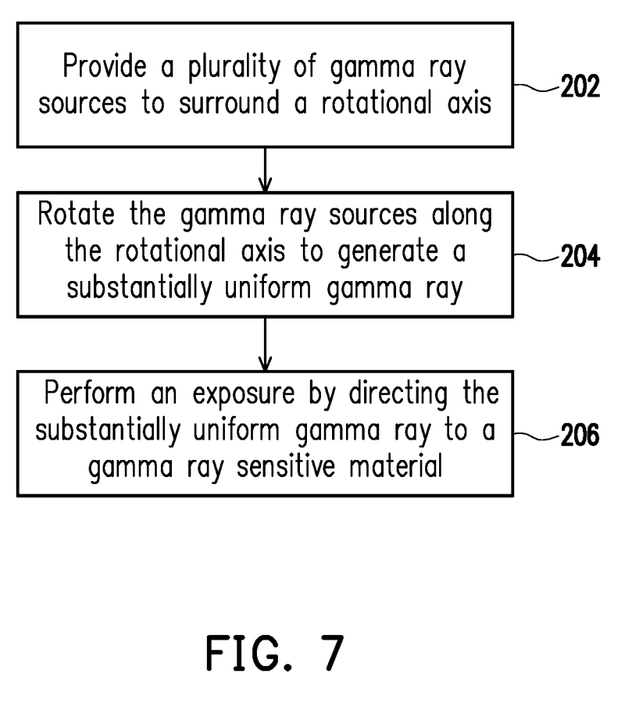
FIG. 7 illustrates a flowchart of a method of performing a gamma ray lithography according to some exemplary embodiments of the present disclosure.

FIG. 7 illustrates a flowchart of a method of performing a gamma ray lithography according to some exemplary embodiments of the present disclosure. While the flowchart of FIG. 7 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At operation 202, a plurality of gamma ray sources are provided to surround a rotational axis. In some embodiments, the gamma ray sources are respectively inserted/placed in holes of the rotational carrier of a gamma ray generator. The gamma ray sources may be radiative metal ingots, pills, pellets or blocks, and the radiative metal ingots, pills or pellets are disposed in tubes with labeled radiative intensity. The radiative intensity of each gamma ray source is substantially the same but slightly different. This step may be performed automatically or manually. After the gamma ray sources are placed, gamma rays are radiated from the gamma ray sources respectively, and the gamma rays are emitted upward and downward from top outlets and bottom outlets of the holes.

At operation 204, the gamma ray sources are rotated along the rotational axis to generate a substantially uniform gamma ray. For example, the rotational carrier of the gamma ray generator is rotated. The rotational carrier is rotated along a rotational axis thereof at a rotational velocity. The rotational axis may be substantially perpendicular to an exposed surface of a wafer secured on a wafer stage. During the rotation, the intensity of the substantially uniform gamma ray is measured by a gamma ray detector, so as to calculate the uniformity of the gamma ray. For example, the gamma ray detector is disposed above the gamma ray generator, and the gamma ray generated and emitted upward is detected by the gamma ray detector. The intensity and/or the uniformity of the gamma ray obtained by the gamma ray detector is substantially equal to the intensity and/or the uniformity of the gamma ray directed to the wafer. In other words, the intensity and/or the uniformity may indicate the exposure condition of the gamma ray onto the wafer. The rotational velocity of the rotational carrier may be adjusted according to the measurements obtained from the gamma ray detector, so as to provide a desired exposure condition. In addition, an amount of the substantially uniform gamma rays incident on the gamma ray sensitive material may be adjusted based on the measured intensity of the gamma ray sources.

At operation 206, the substantially uniform gamma ray is directed to a gamma ray sensitive material, to perform an exposure. For example, the substantially uniform gamma ray is directed to the gamma ray sensitive material by passing through a shutter and a photomask. The shutter or other "on/off" mechanism is disposed between the gamma ray generator and the wafer stage, to block or pass the gamma ray. Therefore, before step 206, whether the substantially uniform gamma ray is directed to the wafer with the gamma ray sensitive material thereon is determined. If yes, the shutter or other "on/off" mechanism is open, and the gamma ray passes therethrough and is directed to the wafer, to perform the exposure. If no, the shutter or other "on/off" mechanism is closed, and the gamma ray is blocked, to stop the exposure.

In some embodiments, the gamma ray is applied to the lithography, and the gamma ray exhibits a shorter wavelength than visible light or even x ray. Due to its shorter wavelength, the gamma ray has the inherent capability of providing better resolution than visible light or x ray. For example, a line having a width of 0.15 angstroms may be formed by exposure with the gamma ray. Furthermore, nature radiative sources such as Cobalt-60, Caesium-137 and Iridium-192 may be adopted as the gamma ray sources, which provide intense streams of fluent emission. In addition, due to the nature radiative sources, there is no power consumption. In some embodiments, the gamma ray lithography may be performed in an atmosphere at normal temperature and normal pressure, and thus heating effect such as mask heating effect may be prevented and additional devices for cooling and maintaining vacuum may be not required.

According to some embodiments, a gamma ray generator includes a rotational carrier and a plurality of gamma ray sources. The rotational carrier is configured to rotate along a rotational axis. The rotational carrier includes a main body and a plurality of holes in the main body. The gamma ray sources are respectively placed in the holes and radiate gamma ray through bottom openings of the holes.

According to some embodiments, a gamma ray lithography system includes a gamma ray generator and a wafer stage. The gamma ray generator is configured to generate a substantially uniform gamma ray. The gamma ray generator includes a plurality of gamma ray sources and a rotational carrier. The rotational carrier is configured to hold the gamma ray sources and rotate along a rotational axis. The wafer stage is disposed below the gamma ray generator and configured to secure a wafer.

According to some embodiments, a method of performing a gamma ray lithography includes the following steps. A plurality of gamma ray sources are provided to surround a rotational axis. The gamma ray sources are rotated along the rotational axis to generate a substantially uniform gamma ray. A gamma ray sensitive material is exposed with the substantially uniform gamma ray.

According to some embodiments, a gamma ray generator includes a plate, a plurality of holes and a plurality of gamma ray sources. The plate is configured to rotate along a rotational axis. The holes are disposed in the plate, and the holes are arranged in a matrix. The gamma ray sources are respectively placed in the holes.

According to some embodiments, a gamma ray generator includes a shaft, a plurality of holders and a plurality of gamma ray sources. The shaft is configured to rotate along a rotational axis. The holders surround and connect to the shaft. The gamma ray sources are respectively placed in the holders.

According to some embodiments, a gamma ray lithography system includes a gamma ray generator and a wafer stage. The gamma ray generator includes a plurality of gamma ray sources, wherein the gamma ray sources are arranged to surround a rotational axis. The wafer stage is disposed below the gamma ray generator.

According to some embodiments, a gamma ray generator includes a plurality of gamma ray sources, wherein the gamma ray sources are arranged to surround a rotational axis.

According to some embodiments, a gamma ray generator includes a rotational shaft, a plurality of holders and a plurality of gamma ray sources. The holders are connected to the rotational shaft. The gamma ray sources are disposed in the holders respectively, wherein the holders respectively have an upper portion and a lower portion connecting to the upper portion, and the gamma ray source is placed at an interface between the upper portion and the lower portion.

According to some embodiments, a method of generating a gamma ray includes the following steps. A plurality of gamma ray sources are provided to surround a rotational axis. The gamma ray sources are rotated along the rotational axis to generate a substantially uniform gamma ray.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A gamma ray generator, comprising:
a plurality of gamma ray sources, wherein the gamma ray sources are arranged to surround a rotational axis, and a distance between the gamma ray sources increases as the gamma ray sources become closer to the rotational axis.

2. The gamma ray generator of claim 1, further comprising a main body comprising a plurality of holes, wherein the gamma ray sources are respectively disposed in the holes.

3. The gamma ray generator of claim 2, wherein the holes are arranged in a matrix.

4. The gamma ray generator of claim 2, wherein a separation between the holes increases as the holes become closer to the rotational axis.

5. The gamma ray generator of claim 2, wherein the main body is a circular plate.

6. The gamma ray generator of claim 1, further comprising a plurality of holders, wherein the gamma ray sources are respectively disposed in the holders.

7. The gamma ray generator of claim 1, wherein the gamma ray sources are arranged along a plurality of imaginary circles, and the distance is formed between the adjacent two gamma ray sources arranged in the same imaginary circle or arranged in the different imaginary circles.

8. A gamma ray generator, comprising:
a rotational shaft;
a plurality of holders connecting to the rotational shaft; and
a plurality of gamma ray sources in the holders respectively, wherein the holders respectively have an upper portion and a lower portion connecting to the upper portion, and the gamma ray source is placed at an interface between the upper portion and the lower portion.

9. The gamma ray generator of claim 8, wherein the gamma ray source radiates a gamma ray through a bottom opening of the lower portion.

10. The gamma ray generator of claim 8, wherein a diameter of the lower portion decreases further away from the upper portion.

11. The gamma ray generator of claim 8, wherein a diameter of the upper portion is substantially constant.

12. The gamma ray generator of claim 8, wherein the upper portion has a top opening and the lower portion has a bottom opening opposite to the top opening, and a diameter of the top opening is not less than a diameter of the gamma ray source, and a diameter of the bottom opening is less than the diameter of the gamma ray source.

13. The gamma ray generator of claim 12, wherein the bottom openings of the lower portions of the holders have substantially the same diameter.

14. The gamma ray generator of claim 12, wherein the top openings of the upper portions of the holders have substantially the same diameter.

15. A method of generating a gamma ray, comprising:
providing a plurality of gamma ray sources to surround a rotational axis; and
rotating the gamma ray sources along the rotational axis to generate a substantially uniform gamma ray, wherein the gamma ray sources emit gamma rays of different radiative intensities.

16. The method of claim 15, wherein the gamma ray sources are provided to have a substantially equal distance to the rotational axis.

17. The method of claim 15, wherein the gamma ray sources are placed in an array to surround the rotational axis.

18. The method of claim 15, wherein a distance between the gamma ray sources increases as the gamma ray sources become closer to the rotational axis.

19. The method of claim 15, further comprising:
- measuring an intensity of the substantially uniform gamma ray; and
- adjusting a rotational velocity based on the measured intensity of the gamma ray sources.

20. The method of claim 15, further comprising:
- measuring an intensity of the substantially uniform gamma ray; and
- controlling an amount of the substantially uniform gamma ray based on the measured intensity of the gamma ray sources.

* * * * *